(12) United States Patent
Balakrishnan et al.

(10) Patent No.: US 9,859,371 B2
(45) Date of Patent: Jan. 2, 2018

(54) SEMICONDUCTOR DEVICE INCLUDING A STRAIN RELIEF BUFFER

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/154,606

(22) Filed: May 13, 2016

(65) Prior Publication Data

US 2017/0154961 A1 Jun. 1, 2017

Related U.S. Application Data

(62) Division of application No. 14/954,051, filed on Nov. 30, 2015.

(51) Int. Cl.
| | |
|---|---|
| *H01L 29/165* | (2006.01) |
| *H01L 29/06* | (2006.01) |
| *H01L 21/02* | (2006.01) |
| *H01L 21/324* | (2006.01) |
| *H01L 21/308* | (2006.01) |
| *H01L 29/78* | (2006.01) |

(Continued)

(52) U.S. Cl.
CPC .... *H01L 29/0692* (2013.01); *H01L 21/02164* (2013.01); *H01L 21/02381* (2013.01); *H01L 21/02532* (2013.01); *H01L 21/02639* (2013.01); *H01L 21/308* (2013.01); *H01L 21/324* (2013.01); *H01L 29/0649* (2013.01); *H01L 29/165* (2013.01); *H01L 29/1054* (2013.01); *H01L 29/161* (2013.01); *H01L 29/7378* (2013.01); *H01L 29/785* (2013.01); *H01L 29/7848* (2013.01)

(58) Field of Classification Search
CPC .......................... H01L 29/7378; H01L 29/7848
See application file for complete search history.

(56) References Cited

U.S. PATENT DOCUMENTS

| | | | | |
|---|---|---|---|---|
| 7,067,430 B2 * | 6/2006 | Maa | ................... | H01L 21/76254 257/E21.568 |
| 7,122,392 B2 * | 10/2006 | Morse | ............... | H01L 21/02381 257/E21.129 |

(Continued)

OTHER PUBLICATIONS

List of IBM Patents or Patent Applications Treated as Related; (Appendix P), Date Filed Jul. 8, 2016, 2 pages.

(Continued)

*Primary Examiner* — Anh Mai
(74) *Attorney, Agent, or Firm* — Cantor Colburn LLP; Louis Percello (57) ABSTRACT

A semiconductor device comprising a substrate having a region protruding from the substrate surface; a relaxed semiconductor disposed on the region; an additional semiconductor disposed on the relaxed semiconductor; and low density dielectric disposed next to and at least partially underneath the relaxed semiconductor and adjacent to the protruding region of the substrate.

6 Claims, 9 Drawing Sheets

(51) Int. Cl.
*H01L 29/161* (2006.01)
*H01L 29/737* (2006.01)
*H01L 29/10* (2006.01)

(56) References Cited

U.S. PATENT DOCUMENTS

| | | | | |
|---|---|---|---|---|
| 8,859,348 | B2* | 10/2014 | Bedell | H01L 21/823807 257/E21.7 |
| 8,927,966 | B2* | 1/2015 | Liu | H01L 21/84 257/24 |
| 9,419,079 | B1* | 8/2016 | Reznicek | H01L 29/1054 |
| 9,530,669 | B1 | 12/2016 | Balakrishnan et al. | |
| 2005/0106790 | A1* | 5/2005 | Cheng | H01L 21/02381 438/172 |
| 2008/0073641 | A1* | 3/2008 | Cheng | B82Y 10/00 257/25 |
| 2012/0104472 | A1* | 5/2012 | Xu | H01L 29/66795 257/288 |
| 2015/0102411 | A1* | 4/2015 | Ching | H01L 21/76205 257/347 |
| 2015/0263097 | A1* | 9/2015 | Cheng | H01L 29/165 257/192 |
| 2016/0190304 | A1* | 6/2016 | Morin | H01L 29/785 257/347 |
| 2017/0229545 | A1* | 8/2017 | Balakrishnan | H01L 29/165 |

OTHER PUBLICATIONS

U.S. Appl. No. 14/954,051, filed Nov. 30, 2015; Entitled—Semiconductor Device Including a Strain Relief Buffer.
List of IBM Patents or Patent Applications Treated as Related; (Appendix P), Date Filed—Mar. 30, 2017; 2 pages.
U.S. Appl. No. 15/258,144, filed Sep. 7, 2016; Entitled—Semiconductor Device Including a Strain Relief Buffer.

* cited by examiner

SEMICONDUCTOR DEVICE INCLUDING A STRAIN RELIEF BUFFER

DOMESTIC PRIORITY

This application is a Divisional of U.S. patent application Ser. No. 14/954,051 filed Nov. 30, 2015 entitled "SEMICONDUCTOR DEVICE INCLUDING A STRAIN RELIEF BUFFER," the contents of which in its entirety are incorporated by reference.

BACKGROUND

Semiconductor materials are typically formed by epitaxial growth on a substrate. When a crystalline substrate is used the crystal structure of the epitaxially grown semiconductor aligns with the crystal structure of the substrate. However, when the epitaxially grown semiconductor comprises atoms which differ in size from the atoms of the substrate, strain is introduced in the epitaxially grown material.

One example is silicon germanium grown on a silicon substrate. The silicon germanium crystal lattice aligns with the silicon crystal lattice. However, the germanium atoms are larger than the silicon atoms so the silicon germanium material is compressively strained.

Strained semiconductors are valued due to better electron mobility and hence better performance. However, defects can arrive in strained materials which have a negative effect on semiconductor device performance.

SUMMARY

Described herein is a method of making a semiconductor device comprising: applying a mask material to a first region on a substrate, wherein the substrate comprises a crystalline material; removing substrate from the unmasked substrate adjacent to the first region to form a recessed region; forming a strained, selectively etchable material in the recessed region; removing the mask material from the first region; forming a semiconductor on the selectively etchable material and first region to produce a strained semiconductor layer; applying mask material to the strained semiconductor layer; forming a trench in the strained semiconductor layer at a distance from the first region wherein the trench extends through the selectively etchable material to the substrate; removing the selectively etchable material after forming the trench to form a continuous cavity comprising the trench and the area resulting from the removed selectively etchable material; filling the continuous cavity with low density dielectric; annealing the strained semiconductor layer and low density electric to produce a relaxed semiconductor; and forming an additional semiconductor material on the relaxed semiconductor.

Described herein is a method of making a semiconductor device comprising: applying a mask material to a first region on a substrate comprising silicon; removing substrate from the unmasked substrate adjacent to the first region to form a recessed region; forming a strained germanium layer in the recessed region; removing the mask material from the first region; forming silicon germanium on the strained germanium layer and first region to produce a strained silicon germanium layer; applying mask material to the strained silicon germanium layer; forming a trench in the strained silicon germanium layer at a distance from the first region wherein the trench extends through the strained germanium region to the substrate; removing strained germanium after forming the trench to form a continuous cavity area comprising the trench and the area resulting from the removed strained germanium; filling the continuous cavity with low density silicon oxide; annealing the low density oxide and strained silicon germanium to produce a relaxed silicon germanium; and forming a semiconductor material on the relaxed silicon germanium.

Also described herein is a semiconductor device comprising a substrate having a region protruding from the substrate surface; a relaxed semiconductor disposed on the region; an additional semiconductor disposed on the relaxed semiconductor; and low density dielectric disposed next to and at least partially underneath the relaxed semiconductor and adjacent to the protruding region of the substrate.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Described herein is a method of making semiconductor device comprising a strained semiconductor disposed on a relaxed semiconductor. The relaxed semiconductor is a low defect or defect free semiconductor material which can serve as a seed source for the epitaxial growth of subsequent semiconductor materials. The relaxed semiconductor allows for the use of a single substrate to produce a range of strained semiconductors with little or no defects. The material of the strain relief buffer can be varied based on the desired strained semiconductor thus no longer constraining the strained semiconductor choice to what can be grown in a defect free manner from the substrate. The lattice constant of the selectively etchable layer in combination with the lattice constant of the strain relief buffer allow the strained semiconductor to be decoupled from the substrate. By using a progressive build strategy, greater choices in the strained semiconductor with a lower incidence of defects is now accessible.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1:
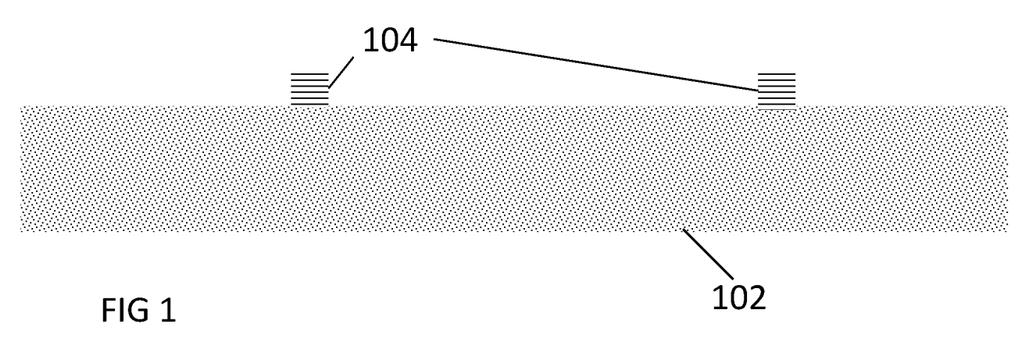
FIG. 1 shows a substrate with mask material disposed on two regions.

With reference now to FIG. 1, a substrate 102 has a mask 104 that is disposed on a first region and a second region. The masked area will become the pedestal holding the relaxed semiconductor once the selectively etchable material is removed. Therefore, the masked area needs large enough to hold the relaxed semiconductor and small enough to allow the semiconductor to relax during the anneal process to result in the relaxed semiconductor. The masked area can have a rectangular shape, square shape, oval shape, or circle shape. It is also contemplated that the shape can be a combination of these shapes or may be irregular in nature, as long as the shape is sufficient to form a pedestal to support the relaxed semiconductor. In some embodiments, the masked area is rectangular shape with a width of 5 nanometers (nm) to 50 nm and length of 100 nm to several micrometers. Exemplary hard mask materials include, for example, silicon nitride (SiN), silicon oxide carbide nitride (SiOCN), and silicon boride carbide nitride (SiBCN). The hard mask can be deposited using chemical vapor deposition (CVD) or any other suitable process.

The substrate comprises a crystalline material suitable as a template for epitaxial growth. Exemplary materials include silicon, silicon germanium, III-V semiconductors, II-VI semiconductors, or a combination comprising at least one of the foregoing. As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors include, but are not limited to GaAs, InAs, InP, InGaAs, InAlAs, InAlAsSb, InAlAsP, AlInGaP, InGaAsP, and alloys thereof. As used herein, the term "II-VI semiconductor" denotes a semiconductor material that includes at least one element from Group II of the Periodic Table of Elements (Zn, Cd, Hg) and at least one element from Group VI of the Periodic Table of Elements (O, S, Se, Te, Po). Typically, the III-V semiconductors may be binary alloys, ternary alloys, or quaternary alloys, of III-V elements. Examples of II-VI semiconductors include, but are not limited to ZnSe, ZnS, ZnTe, CdZnTe, HgCdTe, HgZnTe, HgZnSe, and alloys thereof.

Figure 2:
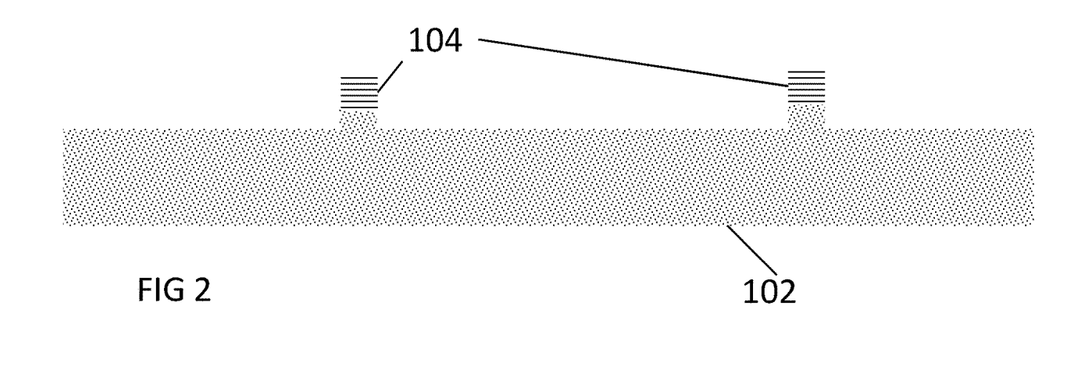
FIG. 2 shows the substrate and mask material after a portion of the substrate has been removed.

Substrate material is removed from the unmasked substrate to form the article shown in FIG. 2. The substrate material can be removed by etching. Exemplary etch processes include dry etching processes and wet etching processes. Dry etching includes, for example, reactive ion etching (ME), ion beam etching, and plasma etching, The amount of substrate removed is chosen based on the material to be formed in the resulting recess. In FIG. 2 the first region and second region protrude from the substrate surface by 1 to 5 nanometers (nm), or 1 to 3 nm, or 1 to 2 nm.

The selectively etchable material is epitaxially grown in the resulting recess may be defect free and the depth of the recess can impact the formation of defects. Because the selectively etchable material crystal structure is related to the crystal structure of the substrate (the substrate templates the crystal structure of the selectively etchable material) the maximum allowable depth for the recess is determined by the lattice constant mismatch between the substrate and the selectively etchable material. A greater the mismatch translates to a higher the strain in the selectively etchable material. Higher strain materials form defects at lower thicknesses.

As used herein, "epitaxy" refers to the deposition of a crystalline overlayer on a crystalline substrate. Methods for epitaxial growth include epitaxial lateral overgrowth (ELOG), metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), or liquid phase epitaxy (LPE).

Figure 3:
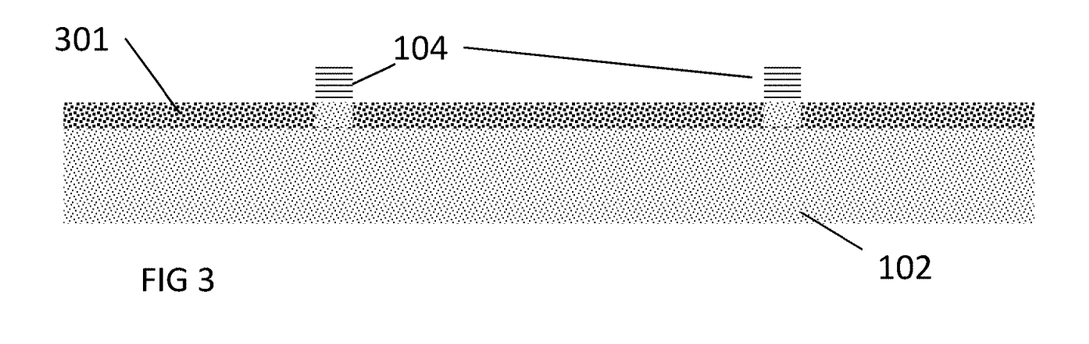
FIG. 3 shows the substrate and mask after the application of a selectively etchable material.

A selectively etchable material 301 is formed by epitaxy of in the area where substrate was removed as shown in FIG. 3. The selectively etchable material may comprise, for example, germanium or indium phosphide. The selectively etchable material is chosen to be removable without removing the substrate or the semiconductor disposed on the selectively etchable material. Sufficient quantity of the selectively etchable material is formed to substantially fill the area where substrate was removed. The surface of the selectively etchable material may be coplanar with the first region and the second region. The selectively etchable material has a thickness of 1 to 5 nanometers (nm), 1 to 3 nm, or 1 to 2 nm. The thickness of the selectively etchable material is chosen to permit formation of a material which is defect free or has very low defect density. In a particular embodiment the selectively etchable material is germanium and has a thickness of 1 to 3 nm.

Figure 4:
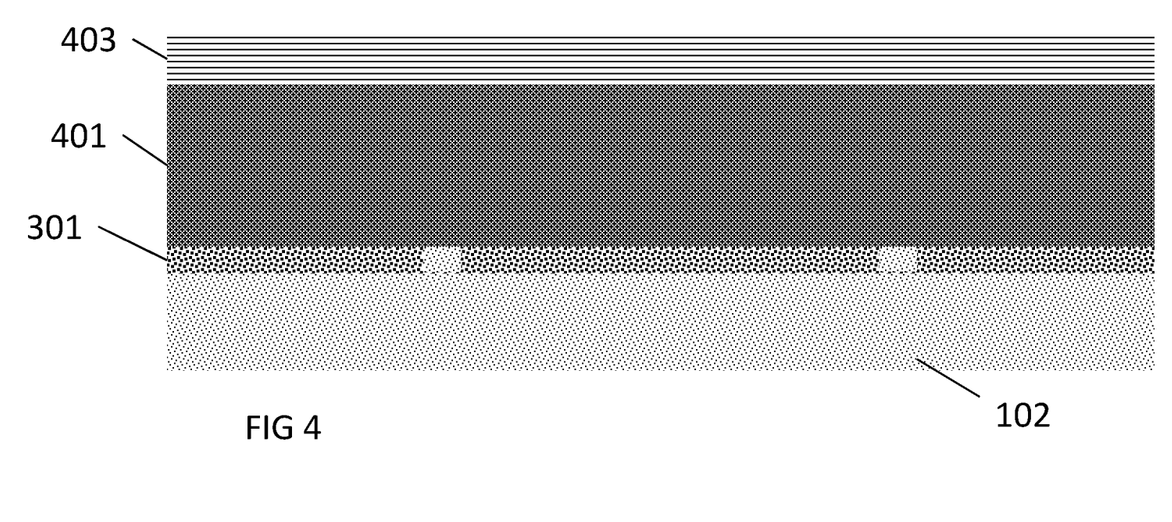
FIG. 4 is a side view showing the removal of the mask and the application of the strained semiconductor and a mask material on the strained semiconductor.

Next, the mask 104 is removed and semiconductor 401 is formed over the selectively etchable material, the first region and the second region as shown in FIG. 4. The semiconductor can be, for example, silicon germanium, III-V, or II-VI material that is different from the selective etchable material 301. The semiconductor is formed by epitaxial growth. Methods for epitaxial growth include epitaxial lateral overgrowth (ELOG), metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), or liquid phase epitaxy (LPE). In some embodiments the semiconductor is silicon germanium having a germanium content of 10 to 80 mole percent, or 20 to 50 mole percent. The semiconductor may have a thickness of 10 nm to 100 nm, or 20 nm to 50 nm. The thickness of the semiconductor 401 may be chosen to result in the formation of a relaxed semiconductor having a defect density less than $1 \times 10^6/cm^3$. A planarization process such as chemically mechanical polishing (CMP) can be performed to planarize the semiconductor after epitaxy. In some embodiments the semiconductor 401 is silicon germanium having a germanium content of 20 to 40 mole percent and a thickness of 30 to 60 nm. FIG. 4 also shows a mask 403 deposited on the semiconductor 401. In one embodiment, mask 403 is silicon nitride.

Figure 5:
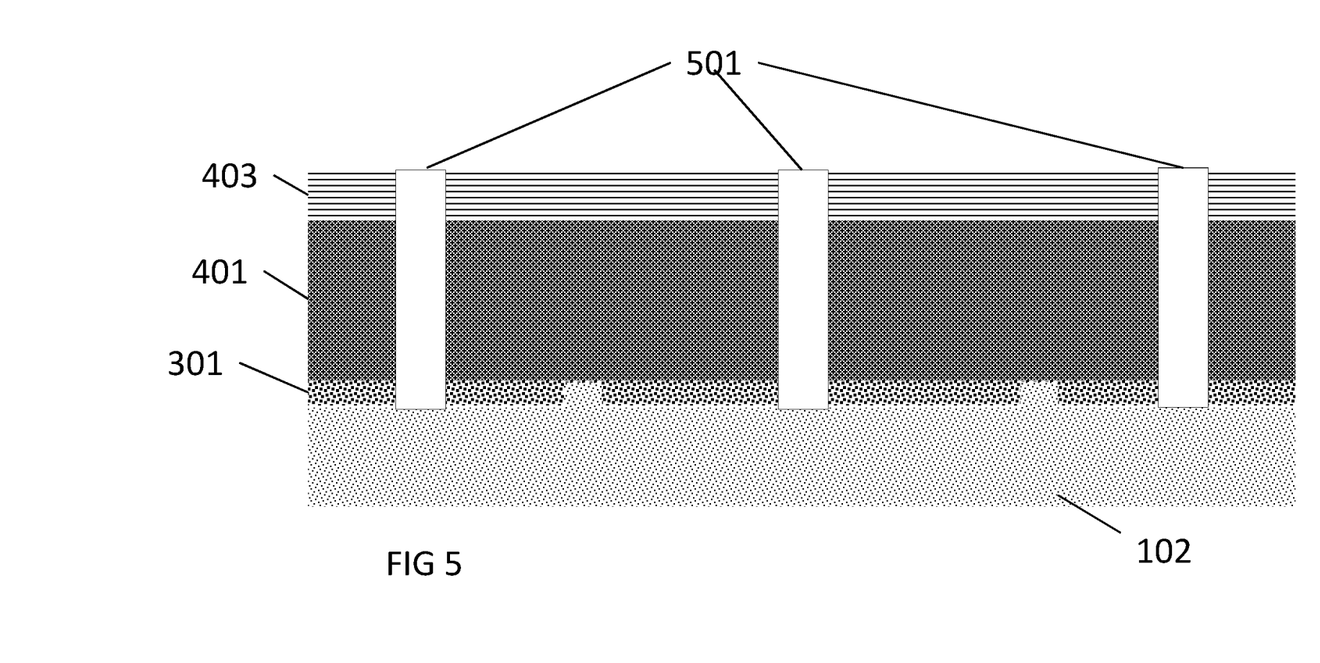
FIG. 5 shows the formation of trenches in the article of FIG. 4.
Figure 6:
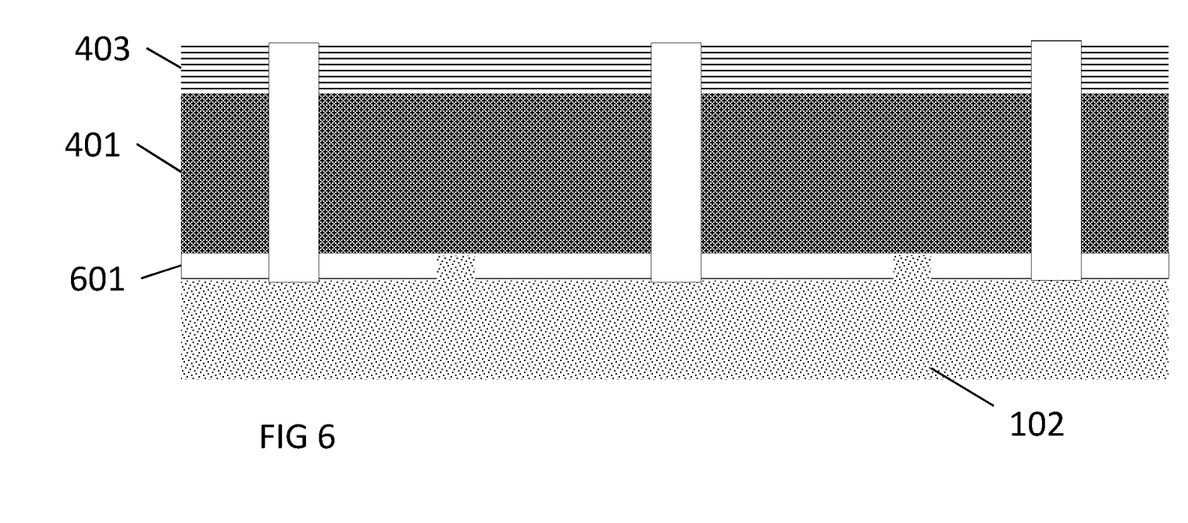
FIG. 6 shows the removal of the germanium layer to form a continuous cavity.

Trenches 501 are then formed using lithography and reactive ion etching as shown in FIG. 5. The trench extends through the selectively etchable material to the substrate. The location and size of the trench is chosen so as to provide access to the selectively etchable material for removal and define the size and shape of the relaxed semiconductor. In some embodiments, the trench has a width of 5 nm to 100 nm. The selectively etchable material is then removed using an appropriate etching method. For example, when the selectively etchable material is germanium the etching method can be a wet etching method using hydrogen peroxide as the wet etchant. The removal of the selectively etchable material results in a continuous cavity 601 as shown in FIG. 6.

Figure 7:
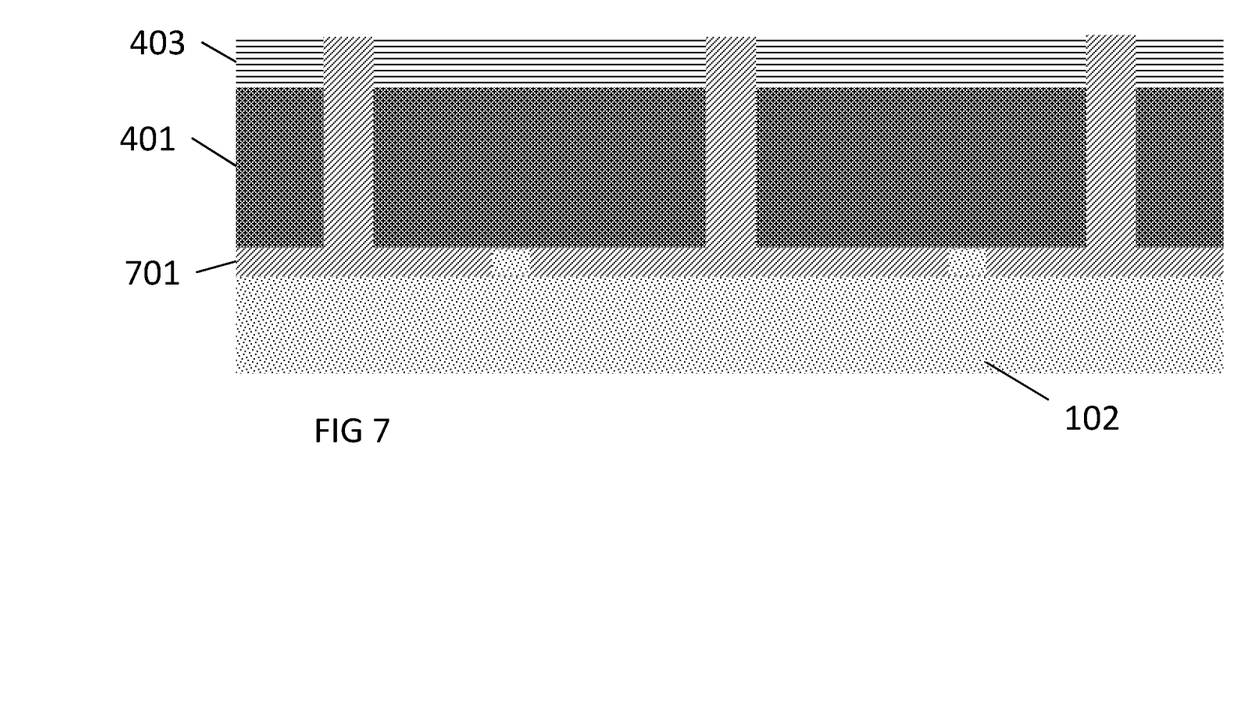
FIG. 7 shows the continuous cavity of FIG. 6 filled with low density dielectric.

The cavities are then filled with low density dielectric 701 as shown in FIG. 7. The low density dielectric can comprise oxides, carbon doped oxide, porous materials, or a combination comprising one or more of the foregoing. Exemplary low density dielectrics include silicon oxide and carbon doped silicon oxide. "Low density" is defined as having sufficiently low density to allow the semiconductor 401 to relax during and/or after annealing. In some embodiments the low density dielectric comprises silicon oxide having a density of 1.5 $g/cm^3$ to 3 $g/cm^3$. The low density dielectric can be deposited by an appropriate method such as chemical vapor deposition (CVD), atomic layer deposition (ALD), spin-on, or other appropriate method. For example, when the low density dielectric comprises carbon doped porous silicon oxide, the silicon oxide is deposited using CVD.

Figure 8:
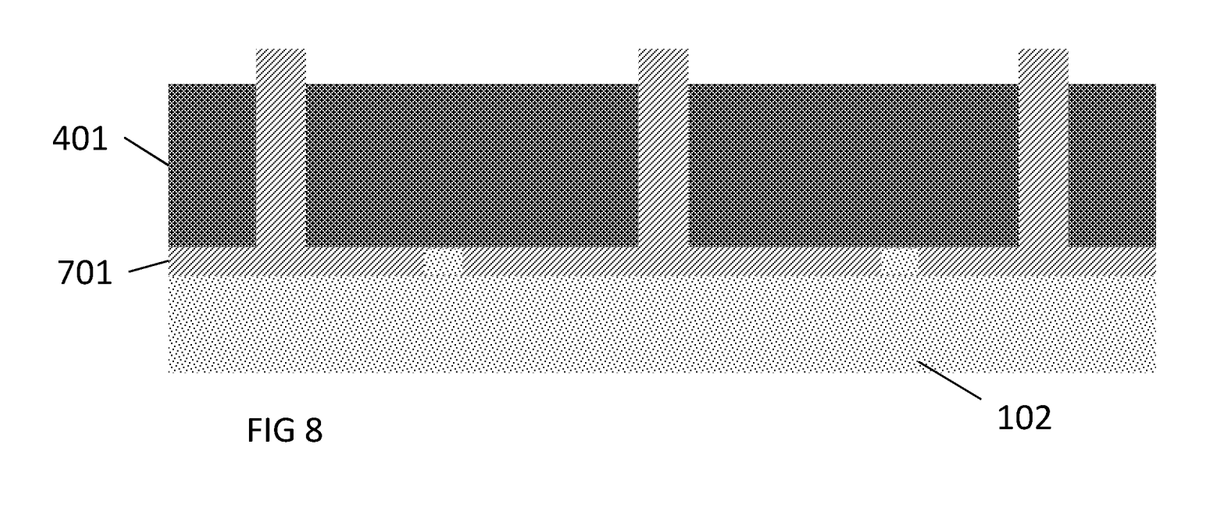
FIG. 8 shows the structure of FIG. 7 after the removal of the mask on the semiconductor material.

FIG. 8 shows the device after removal of the mask 403. In one embodiment, the mask 403 is silicon nitride. It can be removed by phosphorus acid selectively to avoid removal of silicon oxide, silicon germanium, and silicon. After removal of the mask the device is subjected to an annealing process, such as, for example, rapid thermal annealing (RTA), flash lamp annealing, furnace annealing, laser annealing, or a combination comprising one or more of the foregoing. In some embodiments, the annealing process may include multiple steps. During the annealing process, the structure of FIG. 8 is heated to a temperature of 500° C. to 1300° C., or a temperature of 600° C. to 850°. In some embodiments, the annealing process is carried out for a time period of 1 second to 3 hours. When the semiconductor 401 comprises a III-V semiconductor the annealing process can be performed in a pressurized atmosphere of gaseous Group V material corresponding to the Group V material that is present in the III-V semiconductor. Annealing result in the relaxation of the semiconductor 401 to form a relaxed semiconductor 903 as shown in FIG. 9.

Figure 9:
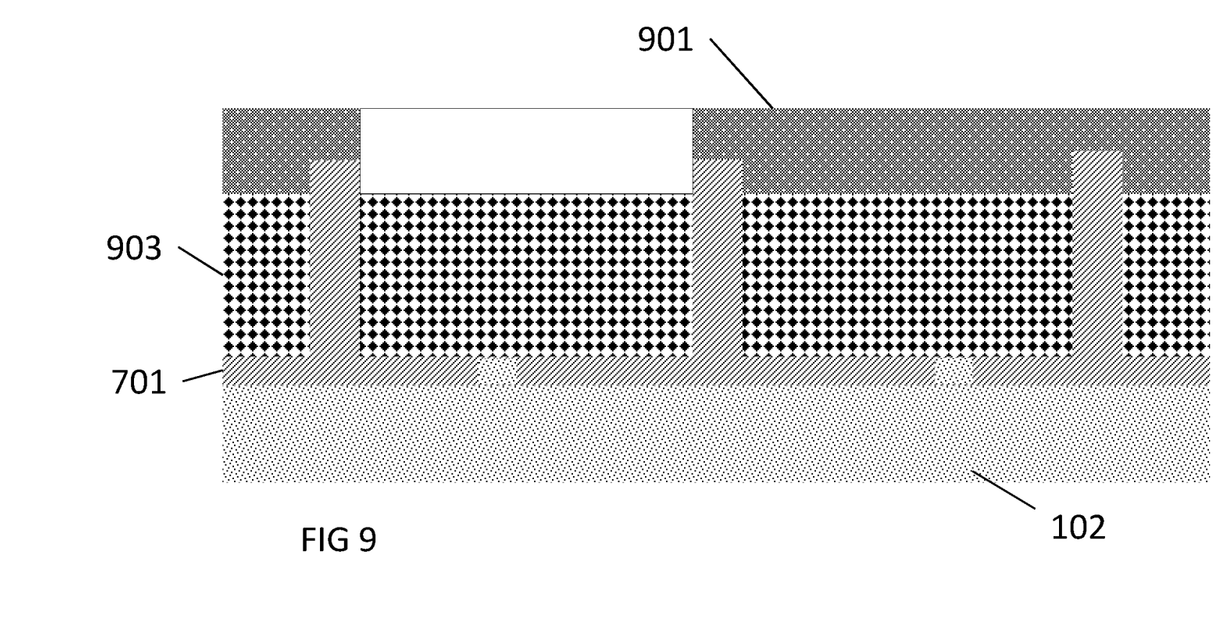
FIG. 9 shows the article of FIG. 8 after annealing and the application of a mask and etching.
Figure 10:
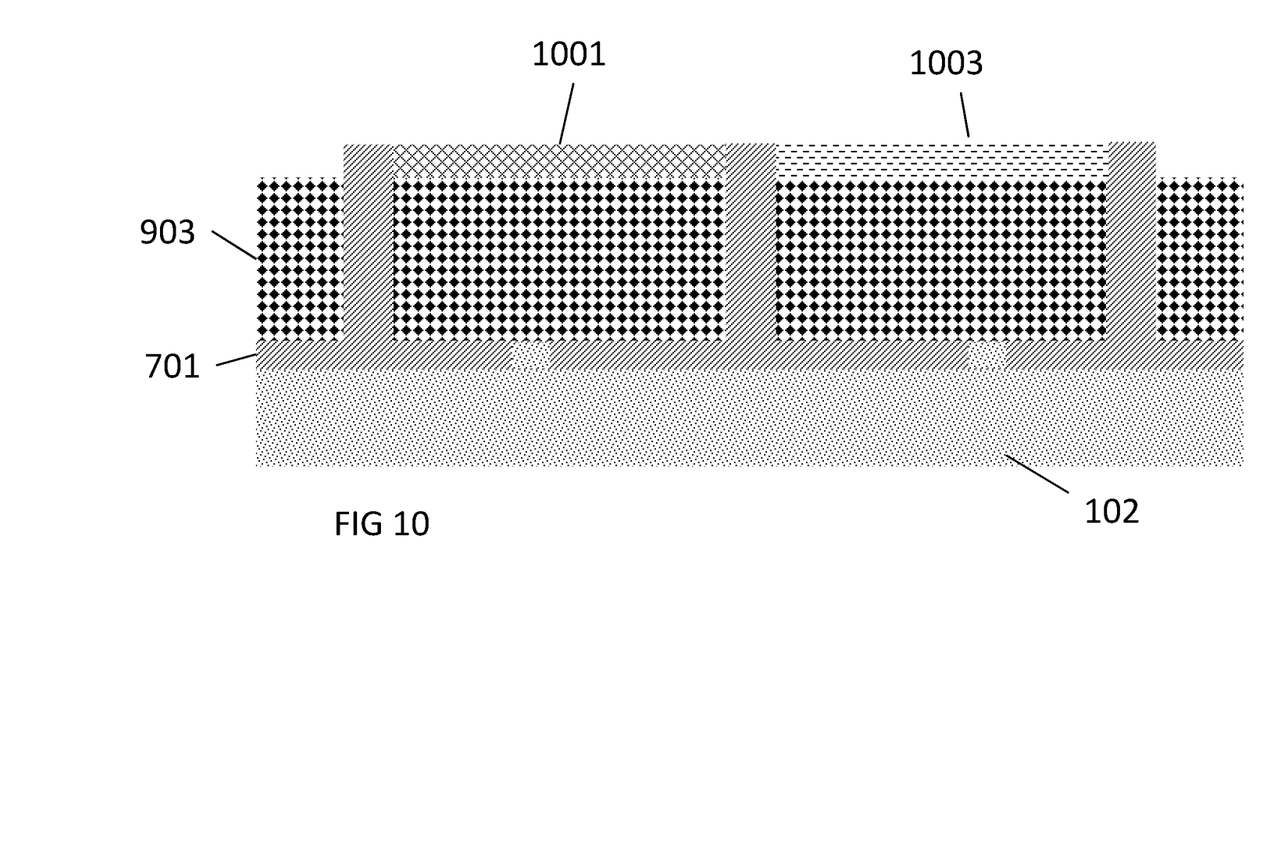
FIG. 10 shows the article of FIG. 9 after the application of two different semiconductors on the relaxed semiconductor.

A mask 901 is then applied to the device and a portion of the relaxed semiconductor 903 is removed to allow for formation of an additional semiconductor on the relaxed semiconductor between the trenches (FIG. 9). It is also contemplated that prior to the application of mask 901 the structure may be planarized using chemical mechanical planarization (CMP). The additional semiconductor can comprise silicon, silicon germanium, germanium, III-V compound semiconductor, a II-VI compound semiconductor, or a combination comprising one or more of the foregoing. In some embodiments, the additional semiconductor materials have the different lattice constants from the underlying layer so that the additional materials are strained. When the relaxed semiconductor and the additional semiconductor comprise silicon germanium the germanium content of the relaxed semiconductor is different from the germanium content of the additional semiconductor. For example, the relaxed semiconductor can comprise a silicon germanium having a germanium content of 20 to 25 mole percent and the additional semiconductor can comprise a silicon germanium having a germanium content of 40 to 50 mole percent. In this case, the additional SiGe is compressively strained. In another case, the additional material is silicon which is tensilely strained. In embodiments where there is a first region and a second region there may be more than one type of semiconductor (1001 and 1003) as shown in FIG. 10. For example, the first additional semiconductor 1001 can comprise silicon germanium and the second additional semiconductor 1003 can comprise silicon.

The above described method results in a semiconductor device comprising a substrate having a region protruding from the substrate surface; a relaxed semiconductor disposed on the protruding region; an additional semiconductor disposed on the relaxed semiconductor; and low density dielectric disposed next to and at least partially underneath the relaxed semiconductor and further disposed next to the additional semiconductor.

More specifically, the above described method can result in a semiconductor device comprising a substrate having a region protruding from the substrate surface; a relaxed silicon germanium semiconductor disposed on the protruding region; an additional semiconductor disposed on the relaxed silicon germanium; and low density silicon dioxide disposed next to and at least partially underneath the relaxed silicon germanium and further disposed next to the additional semiconductor. The additional semiconductor can comprise silicon germanium having a different germanium content than the relaxed silicon germanium. Alternatively, the additional semiconductor can comprise silicon.

It is also contemplated that the above described method can result in a semiconductor device comprising a substrate having a first region protruding from the substrate surface and a second region protruding from the substrate surface; a relaxed silicon germanium semiconductor disposed on the protruding first region and the protruding second region; a first additional semiconductor disposed on the relaxed silicon germanium; a second additional semiconductor disposed on the relaxed silicon germanium; and low density silicon dioxide disposed next to and at least partially underneath the relaxed silicon germanium and further disposed between the first and second additional semiconductors. The first and second additional semiconductors may comprise the same or different materials.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device comprising:
    a substrate having a horizontal surface and a region protruding from the horizontal surface, wherein the region protrudes from the substrate surface in a direction perpendicular to the horizontal surface by 1 to 5 nanometers and wherein the region has a width of 5 to 50 nanometers and a length of 100 nanometers to several micrometers in a direction parallel to the horizontal surface;
    an annealed relaxed semiconductor disposed on the region protruding from the horizontal surface of the substrate, wherein the annealed relaxed semiconductor has a defect density less than $1 \times 10^6/cm^3$;
    a strained semiconductor comprising silicon germanium disposed on the annealed relaxed semiconductor; and
    a low density dielectric disposed next to and at least partially underneath the annealed relaxed semiconductor and adjacent to the region.

2. The semiconductor device of claim 1, wherein the annealed relaxed semiconductor comprises silicon germanium having a germanium content of 20 to 25 mole %.

3. The semiconductor device of claim 1, wherein the strained semiconductor comprises silicon germanium having a germanium content of 40 to 50 mole %.

4. The semiconductor device of claim 1, wherein the low density dielectric comprises silicon oxide and has a density of 1.5 $g/cm^3$ to 3 $g/cm^3$.

5. The semiconductor of claim 1, further comprising:
    a second region protruding from the horizontal surface;
    the annealed relaxed semiconductor disposed on the second region; and
    a low density dielectric disposed next to and at least partially underneath the relaxed semiconductor and between the region protruding from the horizontal surface and the second region protruding from the horizontal surface.

6. The semiconductor of claim 5, further comprising a second strained semiconductor comprising silicon disposed on the annealed relaxed semiconductor disposed on the second region.

* * * * *